United States Patent
Krasulick et al.

(10) Patent No.: US 12,444,723 B2
(45) Date of Patent: Oct. 14, 2025

(54) HETEROGENEOUS BONDING FOR PHOTONIC INTEGRATION

(71) Applicant: Skorpios Technologies., Inc., Albuquerque, NM (US)

(72) Inventors: Stephen B. Krasulick, Albuquerque, NM (US); John Dallesasse, Geneva, IL (US)

(73) Assignee: Skorpios Technologies, Inc., Albuquerque, NM (US)

( * ) Notice: Subject to any disclaimer, the term of this patent is extended or adjusted under 35 U.S.C. 154(b) by 0 days.

(21) Appl. No.: 17/949,022

(22) Filed: Sep. 20, 2022

(65) Prior Publication Data

US 2023/0124445 A1    Apr. 20, 2023

Related U.S. Application Data

(60) Division of application No. 16/452,212, filed on Jun. 25, 2019, now Pat. No. 11,482,513, which is a (Continued)

(51) Int. Cl.
  *G02B 6/122*    (2006.01)
  *G02B 6/12*     (2006.01)
  (Continued)

(52) U.S. Cl.
  CPC ........ *H01L 25/167* (2013.01); *H01L 25/0753* (2013.01); *H01L 25/16* (2013.01);
  (Continued)

(58) Field of Classification Search
  CPC ............... H01L 21/84; H01L 21/76898; H01L 2224/0401; H01L 21/187; H01L 21/30604;
  (Continued)

(56) References Cited

U.S. PATENT DOCUMENTS

| | | | |
|---|---|---|---|
| 4,293,826 | A | 10/1981 | Scifres et al. |
| 5,190,883 | A | 3/1993 | Menigaux et al. |

(Continued)

FOREIGN PATENT DOCUMENTS

| | | |
|---|---|---|
| CN | 101349786 | 1/2009 |
| CN | 104137262 | 11/2015 |

(Continued)

OTHER PUBLICATIONS

Analui, et al.; "A Fully Integrated 20-Gb/s Optoelectronic Transceiver Implemented in a Standard 0.13-mu-m CMOS SOI Technology"; IEEE Journal of Solid State Circuits, vol. 41, No. 12; Dec. 2006; 11 pages; retrieved from the Internet: <http://ieeexplore.ieee.org/abs_all.jsp?arnumber=4014595&tag=1>.

(Continued)

*Primary Examiner* — Ajay Ojha

(74) *Attorney, Agent, or Firm* — Kilpatrick Townsend & Stockton LLP

(57) ABSTRACT

A method of fabricating a composite integrated optical device includes providing a substrate comprising a silicon layer, forming a waveguide in the silicon layer, and forming a layer comprising a metal material coupled to the silicon layer. The method also includes providing an optical detector, forming a metal-assisted bond between the metal material and a first portion of the optical detector, forming a direct semiconductor-semiconductor bond between the waveguide, and a second portion of the optical detector.

16 Claims, 7 Drawing Sheets

Related U.S. Application Data continuation of application No. 15/633,343, filed on Jun. 26, 2017, now Pat. No. 10,373,939, which is a continuation of application No. 14/880,936, filed on Oct. 12, 2015, now Pat. No. 9,709,735, which is a continuation of application No. 14/135,006, filed on Dec. 19, 2013, now Pat. No. 9,190,400, which is a division of application No. 12/902,621, filed on Oct. 12, 2010, now Pat. No. 8,630,326.

(60) Provisional application No. 61/251,132, filed on Oct. 13, 2009.

(51) Int. Cl.

| | | |
|---|---|---|
| *G02B 6/136* | (2006.01) | |
| *H01L 25/00* | (2006.01) | |
| *H01L 25/075* | (2006.01) | |
| *H01L 25/16* | (2023.01) | |
| *H10H 20/01* | (2025.01) | |
| *H10H 20/84* | (2025.01) | |
| *H10H 20/85* | (2025.01) | |
| *H10H 20/857* | (2025.01) | |
| *H01S 5/02* | (2006.01) | |
| *H01S 5/0237* | (2021.01) | |
| *H01S 5/10* | (2021.01) | |

(52) U.S. Cl.
CPC ......... *H01L 25/50* (2013.01); *G02B 6/12002* (2013.01); *G02B 2006/12061* (2013.01); *G02B 2006/12147* (2013.01); *G02B 6/1225* (2013.01); *G02B 6/136* (2013.01); *H01L 2924/00* (2013.01); *H01L 2924/0002* (2013.01); *H01S 5/021* (2013.01); *H01S 5/0237* (2021.01); *H01S 5/1003* (2013.01); *H10H 20/018* (2025.01); *H10H 20/84* (2025.01); *H10H 20/8506* (2025.01); *H10H 20/857* (2025.01)

(58) Field of Classification Search
CPC ............... H01L 21/2007; H01L 21/822; H01L 21/02035; H01L 21/50; H01L 21/76251; H01L 21/00; H01L 25/167; H01L 25/0753; H01L 25/16; H01L 25/50; H01L 33/0093; H01L 33/44; H01L 33/486; H01L 33/62; H01L 2924/00; H01L 2924/0002; G02B 6/12002; G02B 6/1225; G02B 6/136; G02B 2006/12061; G02B 2006/12147; H01S 5/021; H01S 5/0237; H01S 5/1003; H10H 20/018; H10H 20/84; H10H 20/8506; H10H 20/857

See application file for complete search history.

(56) References Cited

U.S. PATENT DOCUMENTS

| | | |
|---|---|---|
| 5,319,667 A | 6/1994 | Dutting et al. |
| 5,333,219 A | 7/1994 | Kuznetsov |
| 5,838,070 A | 11/1998 | Naruse et al. |
| 5,858,814 A | 1/1999 | Goossen et al. |
| 5,981,400 A | 11/1999 | Lo |
| 5,987,050 A | 11/1999 | Doerr et al. |
| 6,002,507 A | 12/1999 | Floyd |
| 6,101,210 A | 8/2000 | Bestwick et al. |
| 6,192,058 B1 | 2/2001 | Abeles |
| 6,242,324 B1 | 6/2001 | Kub et al. |
| 6,429,045 B1 | 8/2002 | Furukawa et al. |
| 6,583,445 B1 | 6/2003 | Reedy et al. |
| 6,667,237 B1 | 12/2003 | Metzler |
| 6,714,566 B1 | 3/2004 | Coldren et al. |
| 6,728,279 B1 | 4/2004 | Sarlet et al. |
| 6,759,746 B1 | 7/2004 | Davies |
| 6,828,657 B2 | 12/2004 | Hara et al. |
| 6,888,989 B1 | 5/2005 | Zhou et al. |
| 6,959,863 B2 | 11/2005 | Figuet et al. |
| 7,058,096 B2 | 6/2006 | Sarlet et al. |
| 7,256,483 B2 | 8/2007 | Epler et al. |
| 7,257,283 B1 | 8/2007 | Liu et al. |
| 7,633,988 B2 | 12/2009 | Fish et al. |
| 7,755,113 B2 | 7/2010 | Yamazaki et al. |
| 7,851,332 B2 | 12/2010 | Yamazaki et al. |
| 7,972,875 B2 | 7/2011 | Rogers et al. |
| 8,106,379 B2 | 1/2012 | Bowers |
| 8,222,084 B2 | 7/2012 | Dallesasse et al. |
| 8,290,014 B2 | 10/2012 | Junesand et al. |
| 8,368,995 B2 | 2/2013 | Dallesasse et al. |
| 8,445,326 B2 | 5/2013 | Dallesasse et al. |
| 8,463,088 B1 | 6/2013 | Asghari et al. |
| 8,559,470 B2 | 10/2013 | Dallesasse et al. |
| 8,605,766 B2 | 12/2013 | Dallesasse et al. |
| 8,611,388 B2 | 12/2013 | Krasulick et al. |
| 8,615,025 B2 | 12/2013 | Dallesasse et al. |
| 8,630,326 B2 | 1/2014 | Krasulick et al. |
| 8,722,464 B2 | 5/2014 | Dallesasse et al. |
| 8,735,191 B2 | 5/2014 | Marchena |
| 8,768,123 B2 | 7/2014 | Yao et al. |
| 8,859,394 B2 | 10/2014 | Dallesasse et al. |
| 9,159,631 B2 | 10/2015 | Marchena et al. |
| 9,190,400 B2 | 11/2015 | Krasulick et al. |
| 9,461,026 B2 | 10/2016 | Dallesasse et al. |
| 9,659,993 B2 | 5/2017 | Dallesasse et al. |
| 9,709,735 B2 | 7/2017 | Krasulick et al. |
| 9,922,967 B2 | 3/2018 | Krasulick |
| 10,373,939 B2 | 8/2019 | Krasulick |
| 2002/0096717 A1 | 7/2002 | Chu et al. |
| 2002/0106893 A1 | 8/2002 | Furukawa et al. |
| 2002/0197013 A1 | 12/2002 | Liu et al. |
| 2003/0042494 A1 | 3/2003 | Worley |
| 2003/0128724 A1 | 7/2003 | Morthier |
| 2004/0037342 A1 | 2/2004 | Blauvelt et al. |
| 2004/0077135 A1 | 4/2004 | Fan et al. |
| 2004/0142575 A1 | 7/2004 | Brewer |
| 2004/0182914 A1 | 9/2004 | Venugopalan |
| 2004/0228384 A1 | 11/2004 | Oh et al. |
| 2004/0245425 A1 | 12/2004 | Delpiano |
| 2004/0253792 A1 | 12/2004 | Cohen et al. |
| 2004/0259279 A1 | 12/2004 | Erchak et al. |
| 2005/0211465 A1 | 9/2005 | Sunohara et al. |
| 2005/0211993 A1 | 9/2005 | Sano et al. |
| 2005/0213618 A1 | 9/2005 | Sochava et al. |
| 2005/0226284 A1 | 10/2005 | Tanaka et al. |
| 2006/0002443 A1 | 1/2006 | Farber et al. |
| 2006/0057836 A1 | 3/2006 | Nagarajan et al. |
| 2006/0093062 A1 | 5/2006 | Yun |
| 2006/0121373 A1 | 6/2006 | Yang et al. |
| 2006/0124954 A1 | 6/2006 | Akaishi |
| 2006/0246636 A1 | 11/2006 | Imai et al. |
| 2007/0002924 A1 | 1/2007 | Hutchinson et al. |
| 2007/0280326 A1 | 12/2007 | Piede et al. |
| 2008/0135859 A1 | 6/2008 | Cho |
| 2008/0181557 A1 | 7/2008 | Wang et al. |
| 2009/0016399 A1 | 1/2009 | Bowers et al. |
| 2009/0065891 A1 | 3/2009 | Dantz et al. |
| 2009/0135861 A1 | 5/2009 | Webster et al. |
| 2009/0245316 A1 | 10/2009 | Sysak et al. |
| 2009/0267173 A1 | 10/2009 | Takahashi et al. |
| 2009/0278233 A1 | 11/2009 | Pinnington et al. |
| 2009/0294803 A1 | 12/2009 | Nuzzo et al. |
| 2009/0294814 A1 | 12/2009 | Assefa et al. |
| 2010/0006972 A1 | 1/2010 | La Tulipe, Jr. et al. |
| 2010/0059822 A1 | 3/2010 | Pinguet et al. |
| 2010/0111128 A1 | 5/2010 | Qin et al. |
| 2010/0166360 A1 | 7/2010 | Jones et al. |
| 2011/0012261 A1 | 1/2011 | Choi et al. |
| 2011/0032964 A1 | 2/2011 | Sauer et al. |
| 2011/0085572 A1 | 4/2011 | Dallesasse et al. |
| 2011/0085577 A1 | 4/2011 | Krasulick et al. |
| 2011/0085760 A1 | 4/2011 | Han et al. |
| 2011/0086461 A1 | 4/2011 | Bolis |

(56) References Cited

U.S. PATENT DOCUMENTS

| | | |
|---|---|---|
| 2011/0089524 A1 | 4/2011 | Nonagaki |
| 2011/0163444 A1 | 7/2011 | Hayashi |
| 2011/0165707 A1 | 7/2011 | Lott et al. |
| 2011/0211604 A1 | 9/2011 | Roscher |
| 2011/0244613 A1 | 10/2011 | Heck et al. |
| 2011/0267676 A1 | 11/2011 | Dallesasse et al. |
| 2012/0001166 A1 | 1/2012 | Doany et al. |
| 2012/0002694 A1 | 1/2012 | Bowers et al. |
| 2012/0057079 A1 | 3/2012 | Dallesasse et al. |
| 2012/0057609 A1 | 3/2012 | Dallesasse et al. |
| 2012/0057610 A1 | 3/2012 | Dallesasse et al. |
| 2012/0057816 A1 | 3/2012 | Krasulick et al. |
| 2012/0091594 A1 | 4/2012 | Landesberger et al. |
| 2012/0104623 A1 | 5/2012 | Pagaila et al. |
| 2012/0120978 A1 | 5/2012 | Budd et al. |
| 2012/0149148 A1 | 6/2012 | Dallesasse et al. |
| 2012/0170931 A1 | 7/2012 | Evans et al. |
| 2012/0189317 A1 | 7/2012 | Heck et al. |
| 2012/0264256 A1 | 10/2012 | Dallesasse et al. |
| 2012/0320939 A1 | 12/2012 | Baets et al. |
| 2013/0037905 A1 | 2/2013 | Shubin et al. |
| 2013/0122617 A1 | 5/2013 | Lott et al. |
| 2013/0189804 A1 | 7/2013 | Marchena |
| 2013/0302920 A1 | 11/2013 | Dallesasse et al. |
| 2015/0104905 A1 | 4/2015 | Park et al. |
| 2015/0123157 A1 | 5/2015 | Dallesasse et al. |
| 2016/0111407 A1 | 4/2016 | Krasulick |

FOREIGN PATENT DOCUMENTS

| | | |
|---|---|---|
| CN | 105336748 | 5/2019 |
| EP | 2648906 A1 | 10/2013 |
| JP | 06224404 | 8/1994 |
| JP | 2004-063730 A | 2/2004 |
| JP | 2004311526 | 11/2004 |
| JP | 2006173568 | 6/2006 |
| JP | 2008-122926 A | 5/2008 |
| JP | 2008-233707 A | 10/2008 |
| JP | 2013-507792 A | 4/2013 |
| JP | 6059151 | 12/2016 |
| JP | 6197183 | 9/2017 |
| JP | 6205563 | 10/2017 |
| KR | 101963465 | 3/2019 |
| SG | 11201403688 R | 12/2015 |
| TW | 2011/40975 A | 11/2011 |
| WO | 2005119776 | 12/2005 |
| WO | 2011/046898 A1 | 4/2011 |
| WO | 2012/078361 A1 | 6/2012 |
| WO | 2013/103769 A1 | 7/2013 |
| WO | 2013/109955 A1 | 7/2013 |
| WO | 2014/025824 A2 | 2/2014 |

OTHER PUBLICATIONS

Bickford, et al. "Electrical Characterization of GaAs Metal Bonded to Si" Applied Physics Letter 89, 012106(2006); doi: 10.1063/1.2219980, Jul. 7, 2006, retrieved from https://doi.org/10.10631/1.2219980, 3 pages.

Coldren et al., "Tunable Semiconductor Lasers: A Tutorial," Journal of Lightwave Technology, Jan. 2004; 22(1):193-202.

Coldren, "Monolithic Tunable Diode Lasers," IEEE Journal on Selected Topics in Quantum Electronics, Nov./Dec. 2000; 6(6):988-999.

Flandorfer; Hans, "Phase Relationships in the In-rich part of the In-PD System", Journal of Alloys and Compounds, vol. 336, Issues 1-2, Apr. 2002, pp. 176-780.

Hildebrand et al., "The Y-Laser: A Multifunctional Device for Optical Communication Systems and Switching Networks," Journal of Lightwave Technology, Dec. 1993; 11 (12):2066-2075.

Isaksson et al., "10 Gb/s Direct Modulation of 40 nm Tunable Modulated-Grating Y-branch Laser, 10 Gb/s Direct Modulation of 40 nm Tunable Modulated-Grating Y-branch Laser," in Optical Fiber Communication Conference and Exposition and the National Fiber Optic Engineers Conference, Technical Digest (CD) (Optical Society of America, 2005), paper OTuE2.

Kuznetsov et al., "Asymmetric Y-Branch Tunable Semiconductor Laser with 1.0 THz Tuning Range," IEEE Photonics Technology Letters, Oct. 1992; 4(10):1093-1095.

Laroy et al., "Characteristics of the New Modulated Grating Y laser (MG-Y) for Future WDM Networks," Proceedings Symposium IEEE/LEOS Benelux Chapter, 2003, Enschede, pp. 55-58, retrieved from the Internet: <http://leosbenelux.org/symp03/s03p055.pdf>.

Laroy, "New Concepts of Wavelength Tunable Laser Diodes for Future Telecom Networks," [dissertation] Universiteit Gent, 2006 [in Dutch and English], 162 pages.

Laroy, "New Widely Tunable Laser Concepts for Future Telecommunication Networks," FTW-symposium, Belgium, 2002; 2 pages total; retrieved from the Internet: <http://photonics.intec.ugent.be/download/pub1625.pdf>.

Magno et al., "Multiphysics Investigation of Thermo-optic Effect in Silicon-on-Insulator Waveguide Arrays," Excerpt from the Proceedings of the COM SOL Users Conference 2006, retrieved from the Internet: <http://lcds.comsol.com/access/dl/papers/1628/Magno.pdf>, 6 pages total.

Morthier et al., "New Widely Tunable Edge-Emitting Laser Diodes at 1.55 1-1m Developed in the European 1st-project Newton," Semiconductor and Organic Optoelectronic Materials and Devices. Edited by Zah, Chung-En; Luo, Yi; Tsuji, Shinji. Proceedings of the SPIE, 2005; 5624:1-8; retrieved from the Internet: <http://photonics.intec.ugent.be/download/pub1800.pdf>.

Morthier, "Advanced Widely Tunable Edge-Emitting Laser Diodes and Their Application in Optical Communications," [presentation], Ghent University—IMEC, 2000, 23 pages total. Can be retrieved from the Internet: <broadband02.ici.ro/program/morthier 3a.ppt>.

Morthier, "New Widely Tunable Lasers for Optical Networks," Newton Project No. IST-2000-28244, Dec. 2001; 5 pages; retrieved from the Internet: <http://www.istoptimist.unibo.iUpdf/network!projects public/NEWTON/Deliverables/D01.pdf>.

Passaro et al., "Investigation of Thermo-Optic Effect and Multi reflector Tunable Filter/Multiplexer in SOI Waveguides," Optics Express, vol. 13, No. 9, May 2005; pp. 3429-3437.

Wesstrom et al., "Design of a Widely Tunable Modulated Grating Y-branch Laser Using the Additive Vernier Effect for Improved Super-Mode Selection," IEEE 18th International Semiconductor Laser Conference, 2002, 99-1 00; retrieved from the Internet: <http://photonics.intec.ugent.be/download/pub1603.pdf>.

Wesstrom et al., "State-of-the-Art Performance of Widely Tunable Modulated Grating Y Branch Lasers," Optical Fiber Communication Conference, Technical Digest (CD) (Optical Society of America, 2004), paper TuE2.

Non-Final Office Action mailed Apr. 23, 2013 for U.S. Appl. No. 12/902,621; all pages.

Restriction Requirement mailed May 17, 2012 for U.S. Appl. No. 12/902,621; all pages.

Non-Final Office Action mailed Sep. 18, 2012 for U.S. Appl. No. 12/902,621; all pages.

Notice of allowance mailed Oct. 2, 2013 for U.S. Appl. No. 12/902,621; all pages.

Final Office Action mailed May 29, 2013 for U.S. Appl. No. 12/903,025; all pages.

Notice of Allowance mailed on Aug. 8, 2013 for U.S. Appl. No. 12/903,025; all pages.

Non-Final Office Action mailed Dec. 5, 2012 for U.S. Appl. No. 12/903,025; all pages.

Final Office Action mailed May 16, 2012 for U.S. Appl. No. 12/903,025; all pages.

Non-Final Office Action mailed Dec. 29, 2011 for U.S. Appl. No. 12/903,025; all pages.

Final Office Action mailed Jun. 17, 2013 for U.S. Appl. No. 13/040,154; all pages.

Notice of Allowance mailed Jul. 26, 2013 for U.S. Appl. No. 13/040,154; all pages.

Non-Final Office Action mailed Dec. 4, 2012 for U.S. Appl. No. 13/040,154; all pages.

(56) References Cited

OTHER PUBLICATIONS

Final Office Action mailed May 16, 2012 for U.S. Appl. No. 13/040,154; all pages.
Non-Final Office Action mailed Jan. 31, 2012 for U.S. Appl. No. 13/040,154; all pages.
Non-Final Office Action mailed Mar. 13, 2012 for U.S. Appl. No. 13/040,179; all pages.
Notice of Allowance mailed Jun. 12, 2013 for U.S. Appl. No. 13/040,179; all pages.
Non-Final Office Action mailed Dec. 12, 2012 for U.S. Appl. No. 13/040,179; all pages.
Final Office Action mailed Aug. 13, 2012 for U.S. Appl. No. 13/040,179; all pages.
Final Office Action mailed Dec. 5, 2012 for U.S. Appl. No. 13/040,181; all pages.
Non-Final Office Action mailed May 22, 2012 for U.S. Appl. No. 13/040,181; all pages.
Notice of Allowance mailed Jun. 16, 2014 for U.S. Appl. No. 13/040,181; all pages.
Notice of Allowance mailed Oct. 4, 2013 for U.S. Appl. No. 13/040,184; all pages.
Restriction Requirement mailed Dec. 21, 2012 for U.S. Appl. No. 13/040,184; all pages.
Non-Final Office Action mailed Apr. 23, 2013 for U.S. Appl. No. 13/040,184; all pages.
Notice of Allowance mailed Sep. 19, 2012 for U.S. Appl. No. 13/076,205; all pages.
Notice of Allowance for U.S. Appl. No. 13/112,142 mailed on Mar. 20, 2012, 8 pages.
Non-Final Office Action mailed Aug. 31, 2012 for U.S. Appl. No. 13/527,394; all pages.
Notice of Allowance mailed Jan. 29, 2013 for U.S. Appl. No. 13/527,394; all pages.
Notice of Allowance mailed on Jan. 17, 2014 for U.S. Appl. No. 13/733,337, all pages.
Non-Final Office Action mailed Aug. 30, 2013 for U.S. Appl. No. 13/869,408; all pages.
Notice of Allowance mailed Jan. 6, 2014 for U.S. Appl. No. 13/869,408; all pages.
U.S. Appl. No. 14/245,191 received a Notice of Allowance, mailed May 27, 2016, 8 pages.
U.S. Appl. No. 14/245,191 received a Final Rejection, mailed Feb. 24, 2016, 11 pages.
U.S. Appl. No. 14/245,191 received a Non-Final Rejection, mailed Aug. 12, 2015, 11 pages.
Pre-Interview Communication dated Apr. 29, 2015 for U.S. Appl. No. 14/562,169, all pages.
U.S. Appl. No. 15/900,590 received a Non-Final Office Action mailed Aug. 31, 2018, 5 pages.
U.S. Appl. No. 15/900,590 received a Final Office Action mailed Dec. 8, 2020, 11 pages.
U.S. Appl. No. 15/900,590 received a Notice of Allowance mailed May 3, 2019, 7 pages.
U.S. Appl. No. 15/633,343 received a Notice of Allowance mailed Mar. 26, 2019, 9 pages.
U.S. Appl. No. 15/633,343 received a Non-Final Office Action mailed Nov. 19, 2018, 12 pages.
Office Action mailed Aug. 4, 2017 for Chinese Patent Application No. 201510646898.4; all pages.
CN 201510646898.4 filed Jan. 18, 2013 received an Office Action mailed Mar. 19, 2018, all pages.
CN 201380005678.2 received an Office Action mailed May 19, 2015, 6 pages.
Extended European Search Report mailed on Dec. 17, 2015 for European Application No. 11847549.0 filed on Nov. 22, 2011; all pages.
European Application No. 13738701.5.0 filed on Jan. 18, 2013 received an office action, mailed May 2, 2018.
International Search Report and Written Opinion mailed Jan. 29, 2014 for International Patent Application No. PCT/US2013/053856; all pages.
International Search Report and Written Opinion mailed Mar. 21, 2012 for International Patent Application No. PCT/US2011/061951; all pages.
International Search Report and Written Opinion mailed on Mar. 1, 2013 for International Application No. PCT/US2013/020226 filed on Jan. 4, 2013; all pages.
International Preliminary Report on Patentability mailed on Jul. 17, 2014 for International Patent Application PCT/US2013/020226 filed on Jan. 4, 2013; all pages.
International Search Report and Written Opinion mailed on May 15, 2013 for International Application No. PCT/US2013/022244 filed on Jan. 18, 2013; all pages.
International Preliminary Report on Patentability mailed on Jul. 31, 2014 for International Patent Application PCT/US2013/022244 filed on Jan. 18, 2013; all pages.
Japanese Office Action mailed Jan. 6, 2016 for Japan Application No. JP2013-543191, 5 pages.
Japanese Office Action mailed Jul. 25, 2016 for Japan Application No. 2014-553476, filed Jan. 18, 2013; all pages.
KR 10-2013-7017576 filed Nov. 22, 2011 received an Office Action mailed Feb. 5, 2018, all pages.
Notice of Decision to Grant mailed on Dec. 22, 2018 for Korean Application KR10-2013-7017576, 3 pages.
U.S. Appl. No. 14/135,006 received a Non-Final Office Action mailed Feb. 6, 2015, 11 pages.
U.S. Appl. No. 14/135,006 received a Notice of Allowance mailed Jul. 17, 2015, 8 pages.
U.S. Appl. No. 14/261,276 received a Non-Final Office Action mailed Mar. 6, 2015, 6 pages.
U.S. Appl. No. 14/261,276 received a Notice of Allowance mailed Jun. 11, 2015, 5 pages.
U.S. Appl. No. 14/482,650 received a Final Office Action mailed Aug. 3, 2016, 11 pages.
U.S. Appl. No. 14/482,650 received a Non-Final Office Action mailed Apr. 21, 2016, 10 pages.
U.S. Appl. No. 14/482,650 received a Notice of Allowance mailed Jan. 19, 2017, 8 pages.
U.S. Appl. No. 14/862,435 received a Non-Final Office Action mailed Jan. 13, 2017, 6 pages.
U.S. Appl. No. 14/862,435 received a Notice of Allowance mailed Nov. 2, 2017, 7 pages.
U.S. Appl. No. 14/880,936 received a Non-Final Office Action mailed Jun. 3, 2016, 9 pages.
U.S. Appl. No. 14/880,936 received a Notice of Allowance mailed Mar. 14, 2017, 8 pages.

HETEROGENEOUS BONDING FOR PHOTONIC INTEGRATION

CROSS-REFERENCES TO RELATED APPLICATIONS

This application is a continuation of U.S. patent application Ser. No. 16/452,212, filed on Jun. 25, 2019, entitled "METHOD AND SYSTEM FOR HETEROGENEOUS SUBSTRATE BONDING FOR PHOTONIC INTEGRATION," which is a continuation of U.S. patent application Ser. No. 15/633,343, filed on Jun. 26, 2017, entitled "METHOD AND SYSTEM FOR HETEROGENEOUS SUBSTRATE BONDING FOR PHOTONIC INTEGRATION," which application is a continuation of U.S. patent application Ser. No. 14/880,936, filed on Oct. 12, 2015, entitled "METHOD AND SYSTEM FOR HETEROGENEOUS SUBSTRATE BONDING FOR PHOTONIC INTEGRATION," now U.S. Pat. No. 9,709,735, issued on Jul. 18, 2017, which application is a continuation of U.S. patent application Ser. No. 14/135,006, filed on Dec. 19, 2013, entitled "METHOD AND SYSTEM FOR HETEROGENEOUS SUBSTRATE BONDING FOR PHOTONIC INTEGRATION," now U.S. Pat. No. 9,190,400, issued on Nov. 17, 2015, which application is a division of U.S. patent application Ser. No. 12/902,621, filed on Oct. 12, 2010, entitled "METHOD AND SYSTEM OF HETEROGENEOUS SUBSTRATE BONDING FOR PHOTONIC INTEGRATION," now U.S. Pat. No. 8,630,326, issued on Jan. 14, 2014, which application claims priority to U.S. Provisional Patent Application No. 61/251,132, filed on Oct. 13, 2009, entitled "HETEROGENEOUS WAFER BONDING FOR PHOTONIC INTEGRATION." The disclosures of all of the above-identified applications are hereby incorporated by reference in their entireties for all purposes. Additionally, the disclosure of U.S. Pat. No. 8,611,388 is hereby incorporated by reference in its entirety for all purposes.

BACKGROUND OF THE INVENTION

Silicon integrated circuits ("ICs") have dominated the development of electronics and many technologies based upon silicon processing have been developed over the years. Their continued refinement led to nanoscale feature sizes that can be critical for making complementary metal oxide semiconductor CMOS circuits. On the other hand, silicon is not a direct bandgap materials. Although direct bandgap materials, including III-V compound semiconductor materials, such as indium phosphide, have been developed, there is a need in the art for improved methods and systems related to photonic ICs utilizing silicon substrates.

SUMMARY OF THE INVENTION

According to an embodiment of the present invention, techniques related to semiconductor fabrication processes are provided. Merely by way of example, embodiments of the present invention have been applied to methods and systems for bonding heterogeneous substrates for use in photonic integration applications. More particularly, an embodiment of the present invention utilizes a hybrid bonding structure including a metal/semiconductor bond and a semiconductor/semiconductor bond in order to achieve low optical loss and high electrical conductivity. The semiconductor/semiconductor bond may be an interface assisted bond. However, the scope of the present invention is broader than this application and includes other substrate bonding techniques.

According to an embodiment of the present invention, a hybrid integrated optical device is provided. The hybrid integrated optical device includes a substrate including a silicon layer and a compound semiconductor device bonded to the silicon layer. The hybrid integrated optical device also includes a bonding region disposed between the silicon layer and the compound semiconductor device. The bonding region includes a metal-semiconductor bond at a first portion of the bonding region. The metal-semiconductor bond includes a first pad bonded to the silicon layer, a bonding metal bonded to the first pad, and a second pad bonded to the bonding metal and the compound semiconductor device. The bonding region also includes an interface assisted bond at a second portion of the bonding region. The interface assisted bond includes an interface layer positioned between the silicon layer and the compound semiconductor device. The interface assisted bond provides an ohmic contact between the silicon layer and the compound semiconductor device.

According to another embodiment of the present invention, a method of fabricating a hybrid integrated optical device is provided. The method includes providing a substrate comprising a silicon layer and providing a compound semiconductor device. The method also includes forming a bonding region disposed between the silicon layer and the compound semiconductor device. The bonding region includes a metal-semiconductor bond at a first portion of the bonding region. The metal-semiconductor bond includes a first pad bonded to the silicon layer, a bonding metal bonded to the first pad, and a second pad bonded to the bonding metal and the compound semiconductor device. The bonding region also includes an interface assisted bond at a second portion of the bonding region. The interface assisted bond includes an interface layer positioned between the silicon layer and the compound semiconductor device, wherein the interface assisted bond provides an ohmic contact between the silicon layer and the compound semiconductor device.

Numerous benefits are achieved by way of the present invention over conventional techniques. For example, embodiments of the present invention provide methods and systems suitable for providing a bond with good mechanical strength, good electrical conductivity, sufficient compliance to allow the composite or hybrid bonding of semiconductor materials with different coefficients of thermal expansion with good reliability, and which also has good optical transparency. This combination of benefits allows both electrical and optical functionality across the bonded interface between two or more distinct semiconductor materials. These and other embodiments of the invention along with many of its advantages and features are described in more detail in conjunction with the text below and attached figures.

DETAILED DESCRIPTION OF SPECIFIC EMBODIMENTS

Embodiments of the present invention relate to an apparatus and method that preferably uses a bonding stress for wafer bonding and utilizes an intermediate layer to facilitate the transition from silicon and the like to another material for optical coupling as well as electron transport. Embodiments of the present invention preferably incorporate low stress, low temperature wafer bonding known in the industry and preferably comprise a thin film intermediate layer for optical coupling as well electron transport.

Figure 1:
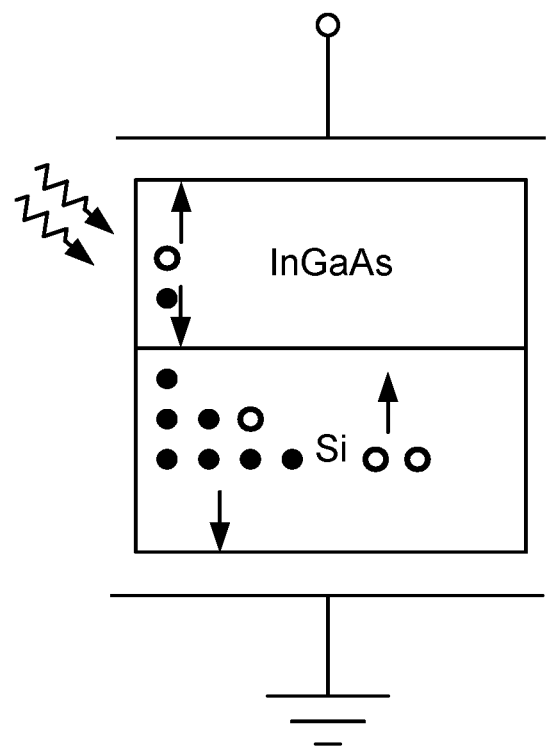
FIG. 1 illustrates an example of a photodiode with a low stress bond between a III-V substrate and a silicon substrate.
Figure 2:
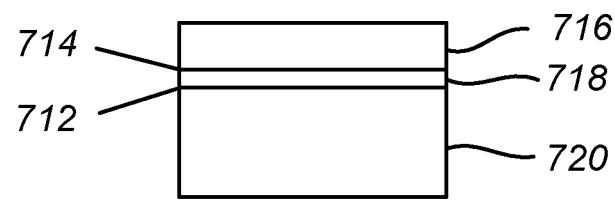
FIG. 2 illustrates a bonded structure according to an embodiment of the present invention.

FIG. 1 illustrates an example of a photodiode with a low stress bond between a III-V substrate and a silicon substrate. FIG. 2 illustrates a bonded structure according to an embodiment of the present invention. As illustrated in FIG. 2, two interfaces 712 and 714 are provided. First interface 712 is positioned between a silicon substrate 720 and an intermediate layer 718. Second interface 714 is located between intermediate layer 718 and a second semiconductor layer 716. Embodiments of the present invention are preferably used in the bonding process to facilitate integration of heterogeneous materials. Embodiments that facilitate integration preferably share the stress due to lattice mismatch between the silicon crystal and the second semiconductor that can form at these two interfaces and can be greatly reduced because of the reduced need for crystalline in the intermediate layer. The intermediate layer can be an alloy whose composition can be graded across the layer to facilitate the bonding at both interfaces 712 and 714.

Intermediate layer 718 is preferably thin, ranging from between approximately 4-5 monolayers to more than approximately 60-70 monolayers, substantially allowing the optical and thermal conduction properties to be virtually unaffected while the electron transport can preferably be achieved via actual carrier transport across the layer. In some embodiments of the present invention, intermediate layer 718 forms thermal and electric contacts at both the first interface and second interface. Embodiments of the present invention can be used in the fabrication of a plurality of high performance optoelectronic components, including but not limited to modulators, lasers, detectors, amplifiers, couplers, wavelength tunable optical components and/or circuits, combinations thereof, or the like. Embodiments as described herein are applicable to a variety of material systems including silicon as illustrated by silicon substrate 720 and/or the like and second semiconductor materials 716, which can be a compound semiconductor material. Utilizing embodiments of the present invention, heterogeneous materials (e.g., compound semiconductors and silicon substrates can be integrated on a common substrate.

The term "bandgap" as used throughout this application includes but is not limited to the energy difference between the top of the valence band and the bottom of the conduction band. The term "optical coupling" as used throughout this application includes but is not limited to placing two or more electromagnetic elements including optical waveguides close together so that the evanescent field generated by one element does not decay much before it reaches the other element. The term "electron transport" as used throughout this application includes but is not limited to an electron transport chain coupling a chemical reaction between an electron donor and an electron acceptor to the transfer of $H^+$ ions across a membrane, through a set of mediating chemical or biochemical reactions. The term "complementary metal oxide semiconductor" as used throughout this application includes but is not limited to technologies for making integrated circuits, microprocessors, microcontrollers, static RAM, digital logic circuits, analog circuits, and highly integrated transceivers.

Embodiments of the present invention optionally utilize several features of intermediate layer 718 as illustrated in FIG. 2. According to an embodiment, the thickness of the intermediate layer 718 is very thin, ranging from a few monolayers (i.e., around 10 Å in thickness) to tens of monolayers. In an embodiment, the intermediate layer is deposited using a deposition technique that provides for uniform coverage at small thicknesses. Exemplary deposition techniques include PVD, ALD, sputtering, e-beam deposition, or the like. Intermediate layer 718 is preferably deposited at relatively low temperatures ranging from temperatures less than 200° C. At these low temperatures, there preferably exist small differences of thermal expansion (i.e., differences in the coefficient of thermal expansion (CTE)) between first interface 712 and second interface 714. Intermediate layer 718 preferably forms thermal contacts at the interfaces and is preferably thermally conductive. Intermediate layer 718 preferably forms good electrical contacts at both interfaces and is preferably electrically conductive. It is not necessary to be crystalline in nature so that the lattice matching at both interfaces is not an issue. In some embodiments, intermediate layer 718 is an alloy material for which the composition varies across the layer.

Embodiments of the present invention are applicable to an apparatus that includes a semiconductor layer that is provided over an intermediate layer that is provided over a silicon substrate layer. The intermediate layer has a lower thermal conductivity than the semiconductor layer. The apparatus also includes a plurality of interfaces that are provided between the semiconductor layer and the underlying layer(s), thereby preventing crystalline lattice mismatch.

Embodiments of the present invention also include a bonding method including forming first and second bonding surfaces on first and second materials, respectively, at least one of the bonding surfaces including an intermediate layer. The method also includes enhancing activation of at least one of said first and second bonding surfaces, terminating at least one of said first and second bonding surfaces with species allowing formation of chemical and electrical bonds, and annealing said first and second materials at a temperature.

Figure 3:
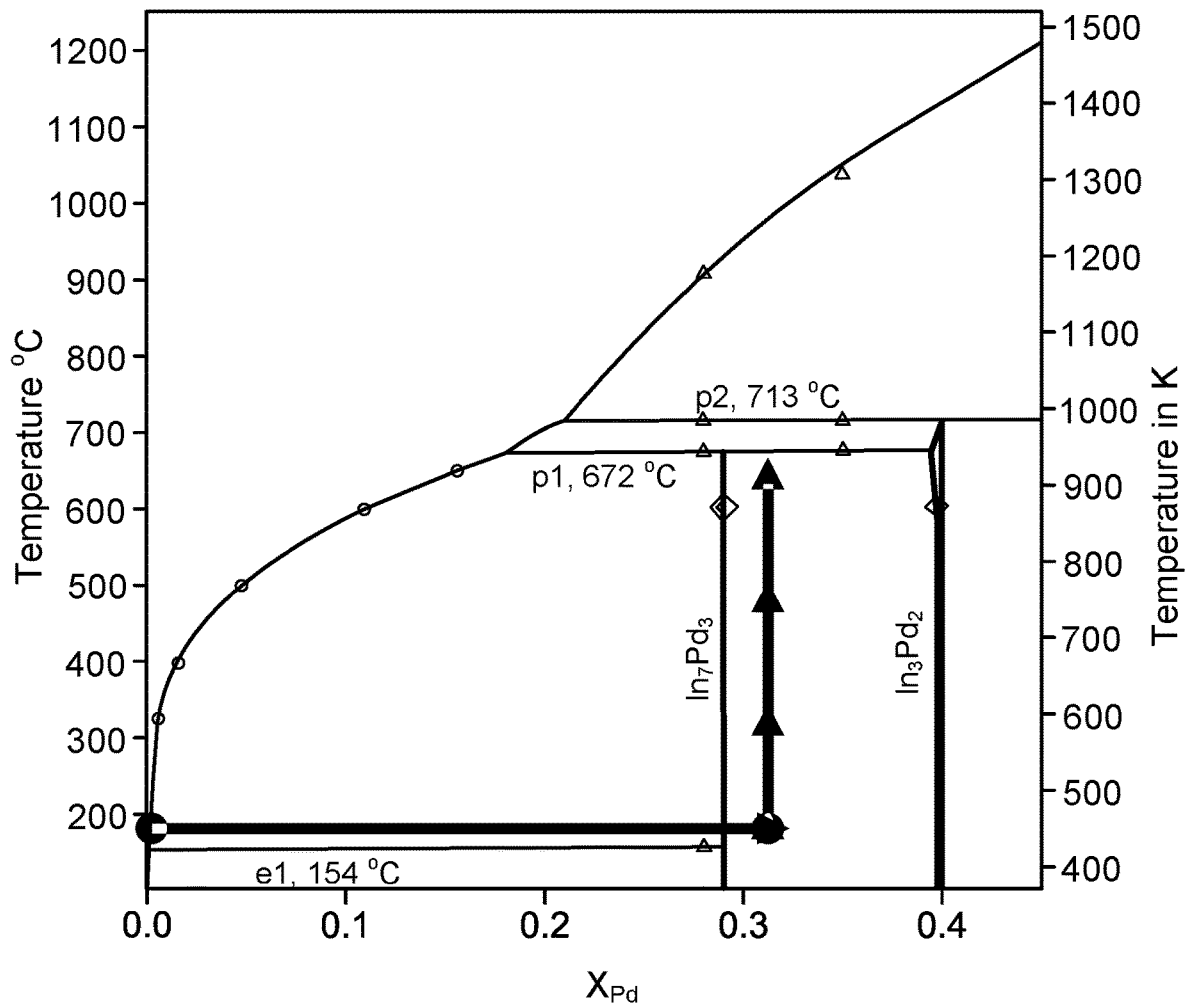
FIG. 3 illustrates a phase diagram showing alloy stability according to an embodiment of the present invention.

FIG. 3 illustrates a phase diagram showing alloy stability according to an embodiment of the present invention. As illustrated in FIG. 3, the stability of the alloy makes such an alloy suitable for use as an intermediate layer such as intermediate layer 718. In some embodiments, the alloy (e.g., $In_xPd_y$) has a small thickness to accommodate stress at the semiconductor-semiconductor interface.

While the embodiments of the invention described herein are directed to wafers used in the semiconductor industry, the invention is also applicable to thermoelectric (TE) cooling technology as well as virtually any application including optical coupling and electron transport.

Merely by way of example, an intermediate layer suitable for use according to embodiments of the present invention is $In_xPd_y$, for example, $In_{0.7}Pd_{0.3}$, which is an alloy that is stable up to very high temperatures as illustrated in FIG. 3. This alloy forms an ohmic contact at interfaces with both silicon and/or III-V materials for which the doping types at either side can be either p-type or n-type. Thus, embodiments of the present invention provide an intermediate layer that provides both ohmic contact between materials on both sides of the intermediate layer, adhesion, optical quality including transparency (i.e., low optical loss), stress accommodation, and other benefits. Other suitable alloys include germanium palladium, gold/germanium, Au/Sn, Al/Mg, Au/Si, palladium, indium/tin/silver alloys, metal alloys containing Bi, Sn, Zn, Pb, or In, combinations thereof, or the like. The optimal alloy will generally have eutectic or peritectic points, and will allow a bonding process temperature in the 350° C. to 500° C. range.

Figure 4:
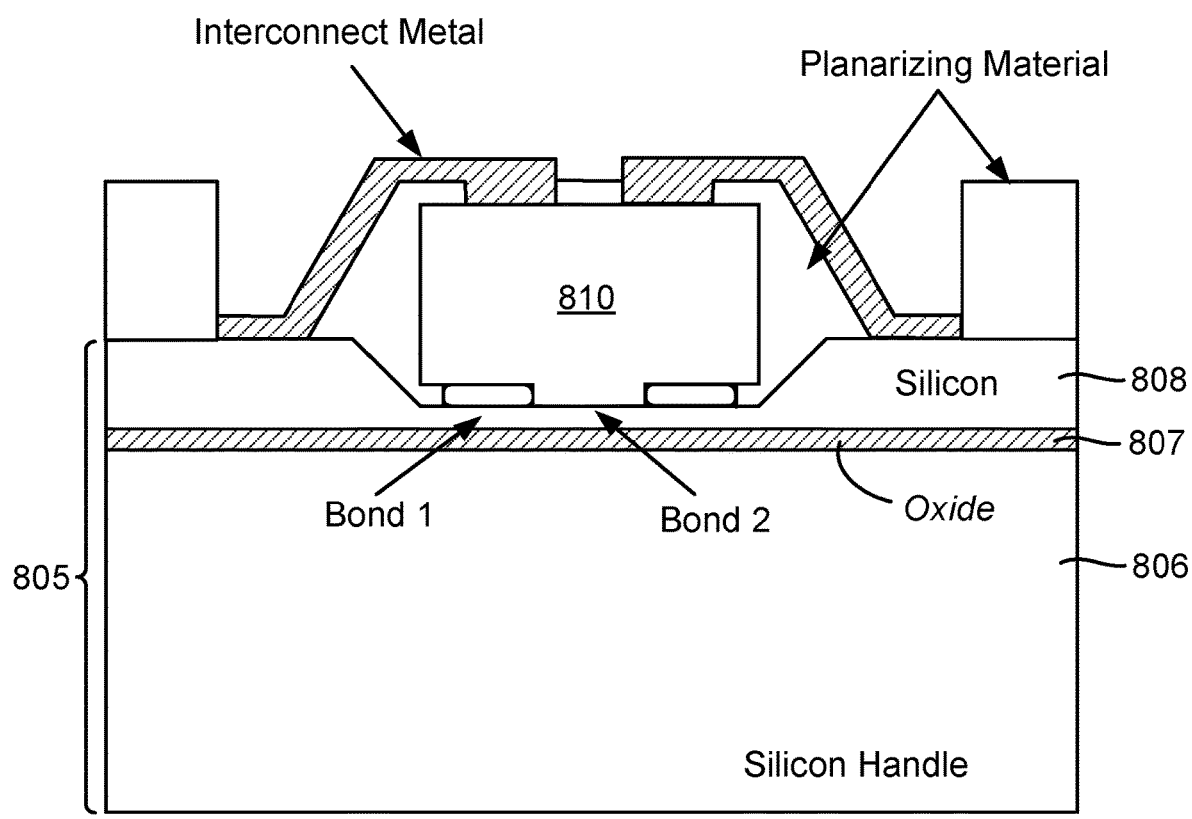
FIG. 4 is a simplified schematic diagram of a compound semiconductor structure bonded to a silicon substrate according to an embodiment of the present invention.

FIG. 4 is a simplified schematic diagram of a compound semiconductor structure bonded to a silicon substrate according to an embodiment of the present invention. Referring to FIG. 4, a composite metal/semiconductor bond is illustrated in relation to bonding of a compound semiconductor device 810 to a silicon-based substrate 805. In the embodiment illustrated in FIG. 4, the silicon-based substrate 805 is a silicon-on-insulator (SOI) substrate although this is not required by embodiments of the present invention. The SOI substrate includes a silicon handle layer 806, a silicon oxide layer 807, and a silicon layer 808, which may be single crystal silicon. Planarizing material is used in the embodiment illustrated in FIG. 4 as well as an interconnect metal that provides for electrical conductivity between portions of the compound semiconductor device 810 and the silicon layer 808 of the SOI substrate. In the embodiment illustrated in FIG. 4, the compound semiconductor device 810 extends to a height above the top surface of the silicon layer 808.

As illustrated in FIG. 4, several bonds are formed between silicon layer 808 and the compound semiconductor device 810. Bond 1 is a metal/metal bond. Associated with Bond 1, pads (not shown in FIG. 4 but illustrated in following figures) are defined on both the SOI substrate (e.g., silicon layer 808) and the compound semiconductor device 810. These pads can include an adhesion metal such as Ti or Cr and a barrier metal such as Pt or Ni. The metal used for the bonding process will typically be a eutectic solder with a eutectic point in the 350° C.-500° C. range. An example of such a eutectic solder is AuGe.

Bond 2 as illustrated in FIG. 4 can be either a direct semiconductor/semiconductor bond or a metal-assisted semiconductor/semiconductor bond. For the metal-assisted semiconductor/semiconductor bond, a thin metal layer (e.g., ranging from one to a few monolayers to a few tens of monolayers) is deposited to improve the robustness of the interface and to better accommodate the CTE differences between silicon and the compound semiconductor device. In an embodiment, the thin metal layer is less than 50 Å in thickness. The very thin interfacial metal will still allow light to pass through without significant attenuation. The direct semiconductor/semiconductor bond can be formed using techniques including either chemical activation or plasma activation of the surfaces and joining the materials together with pressure and low temperature in order to bond the two surfaces together. Direct semiconductor bonding is useful in devices employing evanescent coupling in a waveguide structure as it will have lower optical attenuation than metal-assisted semiconductor bonding.

Figure 5A:
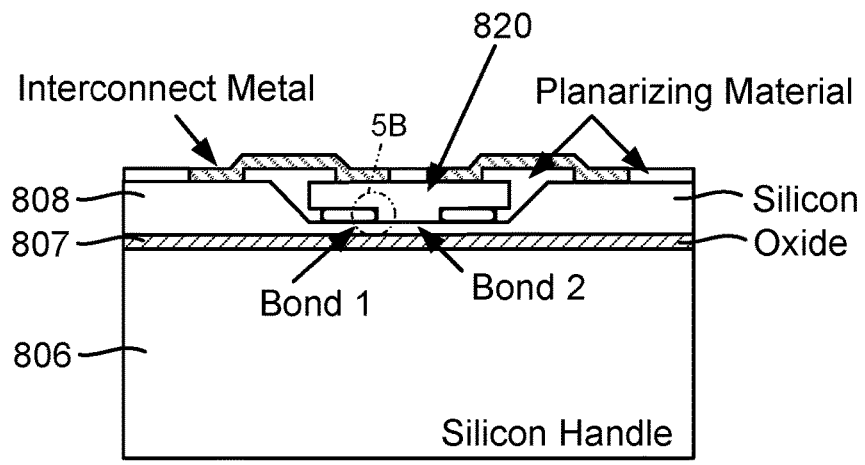
FIGS. 5A-5C are simplified schematic diagrams illustrating bond interfaces according to an embodiment of the present invention.
Figure 5B:
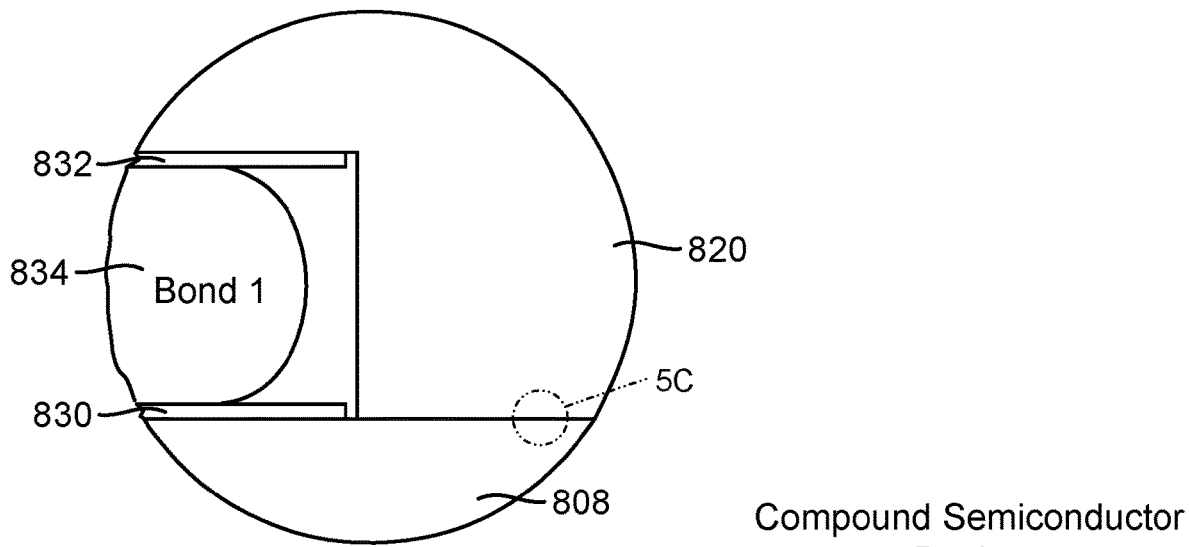
Figure 5C:
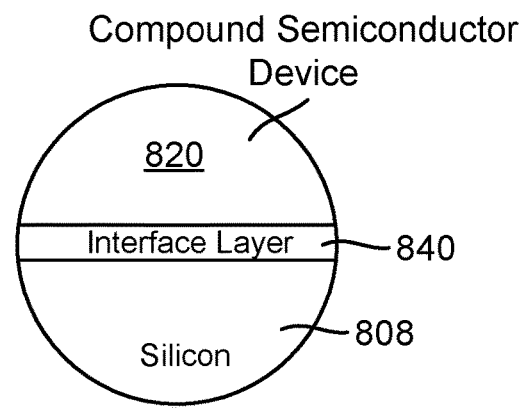

FIGS. 5A-5C are simplified schematic diagrams illustrating bond interfaces according to an embodiment of the present invention. As illustrated in FIG. 5A, the compound semiconductor device 820 has been thinned so that the top surface of the compound semiconductor device 820 is coplanar with the top surface of silicon layer 808. A planarizing material has been used to provide a planar surface extending above the top surface of silicon layer 808. Portions of the planarizing material have been removed (e.g., using a masking and etching process) and interconnect metals have been used to provide for electrical connectivity between portions of the silicon layer 808 and portions of the compound semiconductor device 820.

FIG. 5B illustrates additional details related to Bond 1 including pads 830 and 832 that provide for adhesion between the silicon layer 808, the bonding metal 834 and the compound semiconductor device 820. As discussed in relation to FIG. 4, pads 830 and 832 can include an adhesion metal such as Ti or Cr and a barrier metal such as Pt. The bonding metal 834 can be a eutectic solder such as AuGe. Other pad materials include Ni, W, refractory metals used as barrier layers in silicon-based devices, or the like, and other bonding metals include AuSn, InPd, InSn, InSnAg alloys, combinations thereof, or the like. These materials are listed merely by way of example and other materials that provide for adhesion between surfaces and/or barrier functionality are also included within the scope of the present invention.

FIG. 5C illustrates the use of an interface layer 840 between the compound semiconductor device 820 and the silicon layer 808. As discussed previously, the metal-assisted semiconductor/semiconductor bond illustrated in FIG. 5C includes a thin metal layer that provides beneficial functions including improving the robustness of the interface and accommodating CTE differences between the materials bonded to either side of this interface layer. Interface layers can include suitable materials including materials that provide peritectic properties including metals such as InPd, other metal alloys, combinations thereof, or the like. Gettering materials such as Ti or Cr can also be integrated with the interface layer to getter surface oxides and improve bond properties. For thin layers of interfacial metals, light will be able to pass without significant attenuation. The low optical loss provided by embodiments of the present invention include absorption coefficients that can be computed using waveguide models and the measured absorption properties of the interface layer. The use of an interface layer 840 will also provide an ohmic contact between the silicon layer 808 and the compound semiconductor device 820. Thus, embodiments of the present invention provide an interface that is electrically conductive without significant optical absorption.

Although FIGS. 5A-5C illustrate bonding of a compound semiconductor device to an SOI substrate, embodiments of the present invention are not limited to the bonding of a device to a substrate. Other embodiments of the present invention are applicable to substrate to substrate bonding, also referred to as wafer bonding. Thus, the compound semiconductor device illustrated in the figures can be replaced with a compound semiconductor substrate in the processes and structures described herein. One of ordinary skill in the art would recognize many variations, modifications, and alternatives.

As illustrated in FIG. 5C, an interface layer 840 such as a thin layer (e.g., less than 100 Å) of a metal alloy such as $In_xPd_y$, can be used to accommodate some of the CTE mismatch between the two semiconductor materials. In other embodiments, the interface layer is not present and a direct semiconductor/semiconductor bond is formed for Bond 2. Embodiments of the present invention utilize both a metal/metal bond illustrated by Bond 1 and a direct semiconductor/semiconductor bond or an interface assisted semiconductor/semiconductor bond illustrated by Bond 2. Such a hybrid bonding approach utilizes the benefits provided by both types of bonds to reduce or overcome the disadvantages of low temperature semiconductor/semiconductor bonding including the weak interface as well as the disadvantages of metal/metal bonding including high optical loss in the vicinity of the metal/metal bond. Thus, embodiments of the present invention provide for high strength bonds and electrical conductivity (Bond 1) while enabling low optical loss and electrical conductivity in regions of the structure suitable for light propagation (Bond 2).

Figure 6A:
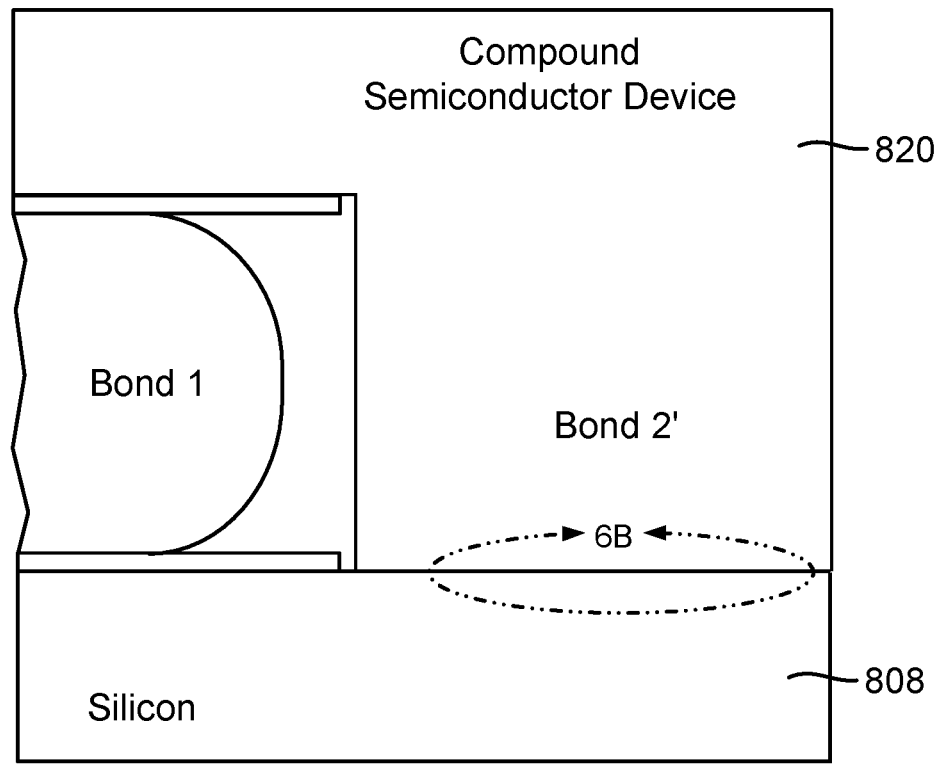
FIGS. 6A-6B are simplified schematic diagrams illustrating bond interfaces according to another embodiment of the present invention.
Figure 6B:
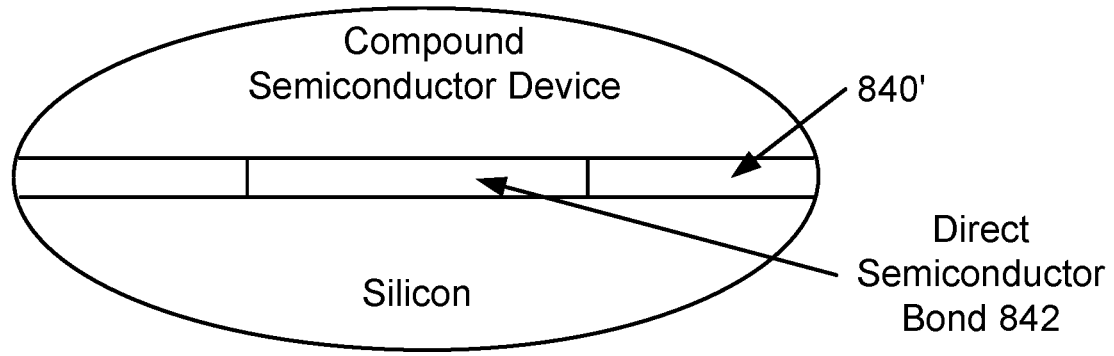

FIGS. 6A-6B are simplified schematic diagrams illustrating bond interfaces according to another embodiment of the present invention. In the case where light propagates parallel to the interface formed at Bond 2 and evanescent coupling is used between the silicon layer 808 and the compound semiconductor device 820, a combination of direct semiconductor-semiconductor bonding and metal-assisted semiconductor-semiconductor bonding may be employed to form Bond 2. This can be achieved by selective patterning of the thin interfacial metal. Referring to FIG. 6A, Bond 2' between the silicon layer 808 and the compound semiconductor device 810 is illustrated. Bond 2' includes not only an interface layer 840' similar to layer 840 in FIG. 5C, but a direct semiconductor-semiconductor bond 842. In the embodiment illustrated in FIG. 6B, the interface layer 840' is patterned to provide regions that are free of the interface layer, which may be a metal layer. As an example, in a light emitting device, the direct semiconductor-semiconductor bond could be positioned adjacent the light emission region to prevent absorption of light by the interface layer. The combination of an interface layer with a direct semiconductor-semiconductor bond thus provides benefits associated with each of the bonding techniques in a hybrid manner.

The bonding processes described herein can be performed in the temperature range from about 350° C. to about 500° C. In a particular embodiment, the temperature associated with the bonding process is in the temperature range of 400° C.-450° C. These temperatures are below the temperature at which CMOS circuits, which may be previously fabricated on the SOI substrate, would be damaged. This enables the integration of complex electrical functions while still providing a robust bond between the dissimilar materials discussed herein.

Figure 7:
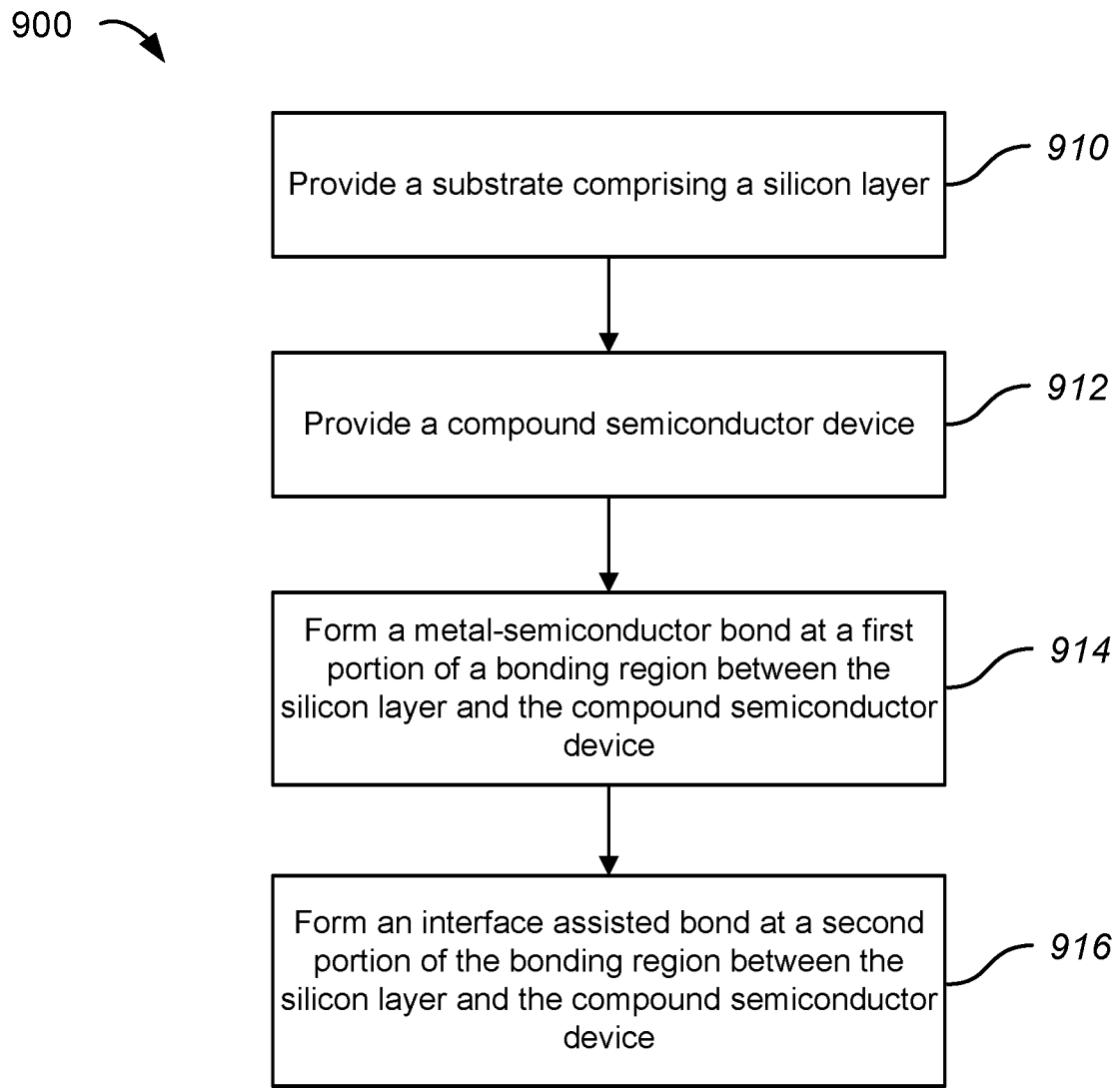
FIG. 7 is a simplified flowchart illustrating a method of fabricating a hybrid semiconductor structure according to an embodiment of the present invention.

FIG. 7 is a simplified flowchart illustrating a method of fabricating a hybrid semiconductor structure according to an embodiment of the present invention. The method 900 includes providing a substrate comprising a silicon layer (910), providing a compound semiconductor device (e.g., an InP semiconductor laser) (912), and forming a bonding region disposed between the silicon layer and the compound semiconductor device. Forming the bonding region includes forming a metal-semiconductor bond at a first portion of the bonding region (914). The metal-semiconductor bond includes a first pad bonded to the silicon layer, a bonding metal bonded to the first pad, and a second pad bonded to the bonding metal and the compound semiconductor device. Forming the bonding region also includes forming an interface assisted bond at a second portion of the bonding region (916). The interface assisted bond includes an interface layer (e.g., $In_xPd_y$) positioned between the silicon layer and the compound semiconductor device. The interface assisted bond provides an ohmic contact between the silicon layer and the compound semiconductor device. In an embodiment, the interface layer has a thickness less than 50 Å.

According to an embodiment, the substrate includes an SOI wafer including a silicon substrate, an oxide layer disposed on the silicon substrate, and the silicon layer is disposed on the oxide layer. In embodiments utilizing a laser or other light generator, the second portion of the bonding region can be substantially free from the interface layer at a position adjacent an active region of the laser or optical generator in order to reduce optical losses. The bonding processes can be performed using low temperature bonding processes, for example, at a temperature ranging from about 350° C. to about 500° C., more particularly, from about 400° C. to about 450° C.

It should be appreciated that the specific steps illustrated in FIG. 7 provide a particular method of fabricating a hybrid semiconductor structure according to an embodiment of the present invention. Other sequences of steps may also be performed according to alternative embodiments. For example, alternative embodiments of the present invention may perform the steps outlined above in a different order. Moreover, the individual steps illustrated in FIG. 7 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 8:
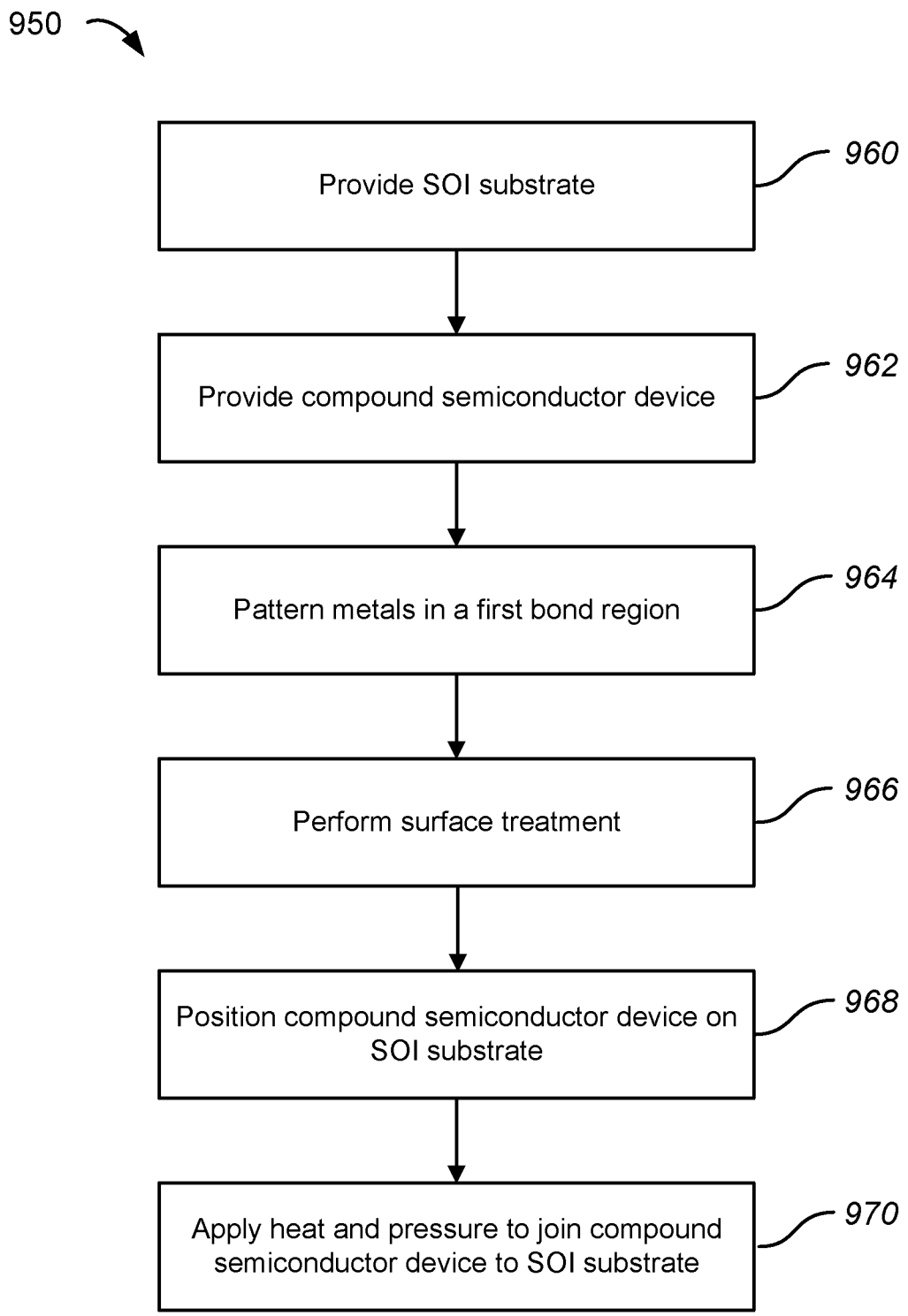
FIG. 8 is a simplified flowchart illustrating a method of fabricating a hybrid semiconductor structure according to another embodiment of the present invention.

FIG. 8 is a simplified flowchart illustrating a method of fabricating a hybrid semiconductor structure according to another embodiment of the present invention. The method 950 includes providing an SOI substrate (960) and providing a compound semiconductor device (962), which can also be referred to as a compound semiconductor die. In an embodiment of the present invention, the SOI substrate includes one or more optical components such as waveguides, optical isolators, reflective structures, or the like and the compound semiconductor device is an InP gain medium.

The method also includes patterning metals in a first bond region (964). The metals can be deposited or formed in a variety of manners. The first bond region can be used for metal-metal bonding and/or for metal-assisted semiconductor-semiconductor bond on one or both materials. After the metals are patterned, a surface treatment is performed (966), for example, a chemical treatment of the surface(s), a plasma activation for a semiconductor-semiconductor bond without metal assist, or the like. The surface treatment can be performed in a controlled atmosphere such as an inert environment, a reduced pressure atmosphere such as a vacuum, or the like. The method further includes positioning the compound semiconductor device on the SOI substrate, such as a receptor site (968) and applying heat and pressure to join the compound semiconductor device to the SOI substrate (970). In an embodiment, the joining step simultaneously effects both metal-based and semiconductor-based bonds.

It should be appreciated that the specific steps illustrated in FIG. 8 provide a particular method of fabricating a hybrid semiconductor structure according to another embodiment of the present invention. Other sequences of steps may also be performed according to alternative embodiments. For example, alternative embodiments of the present invention may perform the steps outlined above in a different order.

Moreover, the individual steps illustrated in FIG. 8 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of forming an integrated optical device, comprising:
    providing a substrate that forms:
        an upper substrate surface, and
        a recess within the upper substrate surface, the recess forming a lower substrate surface, the lower substrate surface and the upper substrate surface defining a recess height therebetween, and wherein one or more first metal pads are deposited on to the lower substrate surface within the recess;
    providing a compound semiconductor device comprising an upper device surface and a lower device surface, wherein:
        the upper device surface and the lower device surface define a device height therebetween, and
        one or more second metal pads are deposited on to the lower device surface;
    bonding the one or more first metal pads to respective ones of the one or more second metal pads, with respective portions of a bonding metal, wherein the bonding metal comprises $In_xPd_y$; and
    depositing a planarizing material that fills at least a portion of the recess.

2. The method of claim 1, wherein the bonding metal comprises $In_{0.7}Pd_{0.3}$ as the bonding metal.

3. The method of claim 1, wherein:
    the substrate comprises a waveguide;
    the compound semiconductor device is configured to emit light; and
    the compound semiconductor device and the substrate are arranged to couple the light emitted by the compound semiconductor device into the waveguide.

4. The method of claim 1, wherein:
    the device height exceeds the recess height, and
    after the bonding, and before subsequent processing, a height of the upper device surface of the compound semiconductor device exceeds a height of the upper substrate surface.

5. The method of claim 1, wherein:
    the substrate comprises a waveguide;
    the compound semiconductor device is configured to emit light; and
    the compound semiconductor device and the substrate are arranged to couple the light emitted by the compound semiconductor device into the waveguide.

6. The method of claim 1, wherein the substrate comprises a silicon waveguide.

7. The method of claim 1, wherein depositing the planarizing material comprises:
    depositing the planarizing material to a height that exceeds a height of an uppermost surface of the compound semiconductor device; and
    covering the uppermost surface of the compound semiconductor device with the planarizing material.

8. The method of claim 7, furthermore comprising:
    forming one or more openings through the planarizing material; and
    forming interconnect metal to couple with the uppermost surface of the compound semiconductor device through the one or more openings.

9. The method of claim 8, wherein forming the interconnect metal comprises forming at least one portion of the interconnect metal that connects an uppermost substrate surface with the compound semiconductor device, through respective ones of the one or more openings.

10. The method of claim 1, wherein bonding the one or more first metal pads to the respective ones of the one or more second metal pads comprises providing $In_xPd_y$ as the bonding metal.

11. The method of claim 1, wherein the one or more first metal pads or the one or more second metal pads comprise at least one of Ti, Cr, Pt, Ni or W.

12. The method of claim 1, wherein the compound semiconductor device is configured to emit light.

13. The method of claim 1, wherein:
    the compound semiconductor device has a lowermost surface, which is lower than the lower device surface; and
    the substrate and the compound semiconductor device form a direct semiconductor/semiconductor contact between the lower substrate surface and the lowermost surface of the compound semiconductor device.

14. The method of claim 1, wherein the compound semiconductor device is a detector.

15. The method of claim 1, wherein the substrate is a silicon-on-insulator (SOI) substrate comprising a silicon device layer and a waveguide in the silicon device layer.

16. The method of claim 1, further comprising thinning the compound semiconductor device to be coplanar with a silicon device layer of the substrate.

* * * * *